United States Patent
Fujita et al.

(10) Patent No.: US 8,065,031 B2
(45) Date of Patent: Nov. 22, 2011

(54) POLISHING END POINT DETECTION METHOD UTILIZING TORQUE CHANGE AND DEVICE THEREOF

(75) Inventors: Takashi Fujita, Mitaka (JP); Satoshi Hasegawa, Mitaka (JP); Shinji Osada, Mitaka (JP); Soushi Yamada, Mitaka (JP); Takuji Atarashi, Mitaka (JP)

(73) Assignee: Tokyo Seimitsu Co., Ltd, Tokyo (JP)

( * ) Notice: Subject to any disclaimer, the term of this patent is extended or adjusted under 35 U.S.C. 154(b) by 837 days.

(21) Appl. No.: 11/900,155

(22) Filed: Sep. 10, 2007

(65) Prior Publication Data

US 2008/0071414 A1 Mar. 20, 2008

(30) Foreign Application Priority Data

Sep. 14, 2006 (JP) .................................. 2006-249978
Jul. 27, 2007 (JP) .................................. 2007-196128

(51) Int. Cl.
*G06F 19/00* (2011.01)
*G05B 13/02* (2006.01)
*G01L 1/00* (2006.01)
*H03F 1/26* (2006.01)
*B24B 49/00* (2006.01)

(52) U.S. Cl. .......... 700/175; 700/31; 700/164; 700/173; 702/41; 702/195; 451/5; 451/21

(58) Field of Classification Search ................... 700/31, 700/38, 108, 109, 121, 164, 170, 173–175, 700/206; 451/1, 5, 8, 10, 11, 21; 702/41, 702/77, 190, 191, 194, 195, 199; 438/5, 438/10, 692, 959; 257/E21.304, E21.528; 216/38, 84

See application file for complete search history.

(56) References Cited

U.S. PATENT DOCUMENTS

| | | | |
|---|---|---|---|
| 5,069,002 A | 12/1991 | Sandhu et al. | 51/165 |
| 5,190,614 A | 3/1993 | Leach et al. | 156/626 |
| 5,876,265 A * | 3/1999 | Kojima | 451/10 |
| 6,293,845 B1 * | 9/2001 | Clark-Phelps | 451/5 |

FOREIGN PATENT DOCUMENTS

JP 61-053728 3/1986
JP 06-315850 11/1994

* cited by examiner

*Primary Examiner* — Sean Shechtman
(74) *Attorney, Agent, or Firm* — Fattibene and Fattibene LLC; Paul A. Fattibene

(57) ABSTRACT

Change in a torque waveform is monitored while removing continuously-varied periodic noise in real time, and the change in the torque waveform caused purely by the wafer state is detected by separating noise components while removing the noise not caused by the wafer state such as drift noise caused by dressing conditions and the polishing pad state, thereby reliably detecting a polishing end point with high precision when polishing is finished. A polishing end point detection device utilizing torque change for analyzing periodic components in data by subjecting Fourier transformation to the measured data, and calculating moving average processing time for removing periodic noise components based on the analyzed periodic components, and correcting the waveform by performing averaging process based on the moving average processing time calculated in real time for the data, and detecting the polishing end point of a predetermined film based on a change in the corrected torque waveform.

8 Claims, 8 Drawing Sheets

POLISHING END POINT DETECTION METHOD UTILIZING TORQUE CHANGE AND DEVICE THEREOF

FIELD OF THE INVENTION

The present invention relates to a polishing end point detection method utilizing torque change and a device thereof and particularly relates to a polishing end point detection method utilizing torque change and device thereof capable of reliably detecting a polishing end point of an conductive film at high precision by monitoring change in a torque waveform while removing periodic noise, which continuously varies in chemical mechanical polishing processing (CMP: Chemical Mechanical Polishing), in real time.

BACKGROUND OF THE INVENTION

There is a known technique in which, when an conductive film on a wafer is to be subjected to chemical mechanical polishing, a polishing end point of the conductive film is detected by monitoring change in a torque waveform (for example, see U.S. Pat. No. 5,069,002). The torque waveform itself measured upon polishing of the conductive film on the wafer includes various disturbances. It is important how the torque waveform is to be processed and what kind of change is to be detected in order to reliably detect the polishing end point.

Meanwhile, as another conventional technique, for example, the following end point detection method is known. In this conventional technique, a box having an arbitrary size having a vertical side h as a torque change amount and a horizontal side was a polishing time width is assumed to be present with respect to an input waveform showing the relation between polishing time and torque change. Then, the waveform is caused to input into the box at a point of h/2 in the vertical side h of one side of the box, and the torque change is analyzed according to the fact that with which side of the box the input waveform intersects with to exit to outside the box. More specifically, the inclination of the torque change is monitored by sorting the change into three types, UP when the input waveform intersects with the upper side to exit, DOWN when it intersects with the lower side to exit, and SIDE when it intersects with the other vertical side to exit. In this box method, the track of the input waveform is analyzed by adjusting the size of the box, and the point when an nth peak or valley is detected in an input waveform that repeats peaks and valleys is detected as a polishing end point (for example, see U.S. Pat. No. 5,190,614).

Furthermore, as another conventional technique, for example the following polishing end point detection device is known. In this conventional technique, a polishing device for polishing and removing an adhering material which is adhering on an undercoat material and different from the undercoat material has a measurement mechanism which measures the torque of at least either one of a first rotating shaft which drives a platen and a second rotating shaft which rotates a substance to be polished and a determination means which determines the fact that at least either one of the torque measured by the measurement mechanism and the temporal differentiation value of the torque is changed equal to or more than a set value, which is provided in advance. In the next stage of the measurement mechanism, a low pass filter having a cut-off frequency corresponding to a rotating speed lower than the rotating speed that is larger among the rotating speed of the first rotating shaft and the rotating speed of the second rotating shaft or a notch filter having a notch frequency corresponding to the rotating speed of at least either one of the rotating speed of the first rotating shaft and the rotating speed of the second rotating shaft is inserted so as to remove noise from the measured torque, and a polishing end point is detected from the determination result of the determination means (for example, see Japanese Patent Application Laid-Open (kokai) No. 1994-315850).

Meanwhile, as a conventional technique relating to the polishing end point detection method, for example, the following end point detection method is known. In this conventional technique, a box having an arbitrary size having a vertical side h as a torque change amount and a horizontal side was a polishing time width is assumed to be present with respect to an input waveform showing the relation between polishing time and torque change. Then, the waveform is caused to input into the box at a point of h/2 in the vertical side h of one side of the box, and the torque change is analyzed according to the fact that with which side of the box the input waveform intersects with to exit to outside the box. More specifically, the inclination of the torque change is monitored by sorting the change into three types, UP when the input waveform intersects with the upper side to exit, DOWN when it intersects with the lower side to exit, and SIDE when it intersects with the other vertical side to exit. This box method is good at analyzing the track of the input waveform by adjusting the size of the box. Therefore, this method is suitable for the case in which the point at which an nth peak or valley in an input waveform repeating peaks and valleys is detected is assumed as an end point (for example, see U.S. Pat. No. 5,190,614).

Moreover, as another conventional technique relating to a polishing end point detection method, for example the following polishing end point detection device is known. In this conventional technique, a polishing device for polishing and removing an adhering material which is adhering on an undercoat material and different from the undercoat material has a measurement mechanism which measures the torque of at least either one of a first rotating shaft which drives a platen and a second rotating shaft which rotates a substance to be polished and a determination means which determines the fact that at least either one of the torque measured by the measurement mechanism and the temporal differentiation value of the torque is changed equal to or more than a set value, which is provided in advance, and the polishing end point is detected according to the determination result of the determination means (for example, see Japanese Patent Application Laid-Open (kokai) No. 1994-315850).

Furthermore, as another conventional technique relating to a polishing end point detection method, for example, the following etching end point determination method is known. This conventional technique is an end point determination method of dry etching using a emission spectrography, wherein, in order to improve precision of end point determination, the sampling period of emission intensity is shortened as much as possible within the permissive range of the ability of a digital arithmetic processing device to increase the number of sampling, and the value averaged while moving at every sampling time, in other words, a moving average value is used as a new sampling value, thereby removing the noise components of actual measurement values. A primary differential value obtained from the moving average sampling values is further subjected to moving averaging, and a difference therebetween is obtained, and a moving average value of the difference value is further used to obtain a secondary differential value of the emission intensity, thereby detecting the end point of etching at high precision (for example, see Japanese Patent Application Laid-Open (kokai) No. 1986-53728).

In the conventional technique described in U.S. Pat. No. 5,069,002, the polishing end point is detected by monitoring the torque waveform measured upon polishing. However, the torque waveform itself includes various disturbances. Therefore, the polishing end point cannot be detected merely by simply monitoring the change in the torque waveform. In order to develop it to a practical level, it cannot be applied to an actual process unless any variation of the torque waveform after processing the obtained torque data can be detected somehow.

In the conventional technique described in U.S. Pat. No. 5,190,614, the point at which the nth peak or valley is detected in the waveform which shows the relation between the polishing time and torque change and repeats peaks and valleys is detected as the polishing end point. However, there is sudden reduction or the like at the polishing end point in the torque change upon polishing of the conductive film on the wafer. Therefore, when the box is applied, there is a problem that the polishing end point cannot be detected unless the condition that UPs and DOWNs are continuously detected n times is satisfied, and the polishing end point is erroneously detected when the polishing torque of an conductive film on a wafer having an individual difference. In addition, the analysis of the torque change is digitally determined by "0" and "1" wherein exit of the torque waveform to outside the box is waited for after it is input into the box. Therefore, analysis of the inclination degree (numerical value) of the waveform is not performed, parallel use of an application algorithm is difficult, and detecting the polishing end point in real time is difficult. Moreover, disturbances of drift components such as the surface state of a polishing pad cannot be removed.

In the conventional technique described in Japanese Patent Application Laid-Open (kokai) No. 1994-315850, noise is removed by using the low pass filter and the notch filter, and the polishing end point is detected by the differential value of the torque from which the noise is removed or the differential value of the torque. Hereinafter, different points between the conventional technique described in Japanese Patent Application Laid-Open (kokai) No. 1994-315850 (hereinafter, simply referred to as the conventional technique) and the present invention will be described, for example, about the removing method of the disturbances relating to the torque waveform and the way how the information relating to the polishing end point is to be determined in the state disturbance elements are removed.

In the conventional technique, the disturbances are removed by using the low pass filter and the notch filter. However, for example, low-frequency noise cannot be removed merely by the low pass filter. Therefore, in order to remove such periodic noise, periodic oscillation caused by rotation of the platen and the head is removed by the notch filter. The materials to be processed in the conventional technique are planarly formed magnetic devices, optical parts, electrical wiring, optical wiring and the like. However, in such series of parts, the noise state during polishing is expected to be constant at the beginning and after finish of the polishing, and the case in which it is changed merely in the vicinity of polishing end is expected. Therefore, among the periodic oscillation to be removed, merely fixed periodic components that is the rotation of the platen and the polishing head are removed.

On the other hand, the oscillation generated in the material to be polished in the present invention is apparently different from the vibration state in such wide polishing processing process. First of all, in a planarization process treated in the present invention, minute irregularities are present on the surface of a wafer, and a multi-layer wiring or the like is formed by planarizing the minute irregularities. Such minute irregularities are uniformly formed in the wafer surface state having swellings, and, upon polishing, the minute irregularities are required to be planarized while uniformly polishing along with such swellings. Therefore, the friction condition upon polishing is apparently different between the wafer surface state at the beginning of polishing and the wafer surface state immediately after polishing is finished. At the beginning, since there are minute irregularities, the friction force is large, and, corresponding to that, disturbances caused by unique oscillation of various members are mixed.

However, in the vicinity of polishing end, the wafer surface is comparatively smooth and the friction force is also small since sufficient planarization that ensures the focal depth of a stepper for forming multi-layer wiring is achieved. Therefore, corresponding to that, the ratio that the disturbance elements due to unique oscillation of various members are mixed is also small. As described above, in the polishing process used in device wafer planarization in the present invention, the oscillation state is apparently changed between the vicinities of the beginning and end of polishing, and the disturbance condition mixed in the torque waveform is also largely changed.

The method for removing fixed noise has been described in the conventional technique; however, such method can never be utilized for removing the disturbance components of the torque waveform in device wafer planarization, since the periodic components that continuously varies in real time is more dominant as disturbance elements in planarization CMP rather than the fixed periodic components such as the platen or polishing head. Therefore, as a disturbance removing method of the torque waveform in device wafer planarization, removing periodic noise that continuously varies in real time is required instead of fixed periodic noise.

Furthermore, in CMP that is necessary for planarization of semiconductor device wafers, the factor that varies torque is not only the state of the wafers. The surface state of a polishing pad that is changed by dressing is also a large factor of torque variation. For example, since the polishing pad surface is largely dressed (conditioned) when dressing is performed by a dresser having a large dressing effect, the friction force between the wafer and the polishing pad is increased, and, as a result, the monitored toques is also increased. On the other hand, since clogging occurs in the polishing pad when dressing is not performed, the wafer slides on the polishing pad, and the monitored torque is reduced.

In the present invention, there are a case of in situ dressing and a case of interval dressing often depending on the polishing process. In situ dressing is the case in which dressing is performed at the same time as polishing. In interval dressing, dressing is performed in the period between polishing and polishing, and dressing is not performed during polishing. Particularly, in the case of interval dressing, clogging in the surface state of the polishing pad is slightly and gradually progressed during polishing since dressing is not performed during polishing although dressing is performed before polishing. As a result, regardless of the surface state of the wafer, torque of the polishing is gradually reduced even when a normal blanket oxide film wafer is polished.

In the case of in situ dressing, the torque is constant in principle when dressing corresponding to the degree of clogging in the plane of the polishing pad is performed in real time in accordance with the clogging of the polishing pad. However, in practice, a small dresser is used, and dressing is performed by causing the dresser to scan in the radius direction of the polishing pad. Therefore, in principle, the clogging of the polishing pad cannot be removed at once, and merely part of the polishing pad is subjected to dressing in one rotation of the platen; therefore, the torque monitored as a result is not completely constant, and a torque waveform corresponding to the scan of the dresser is observed.

When torque is actual monitored in this manner, not only the torque variation due to the surface state of the wafer is always monitored, and the torque variation corresponding to the state of the polishing pad and the state of dressing during polishing is also mixed as disturbance elements. The waveform of the disturbance element due to the surface state of the polishing pad is gradually changed as a kind of drift; therefore, it cannot be removed as the periodic noise described above. Also, it is obvious that it cannot be removed even by the low pass filter. Therefore, even when the periodic waveform variation is removed, removing the noise that gradually varies along with the change in the surface state of the polishing pad is difficult, and it is expected that such disturbances are erroneously detected in the conventional method.

The conventional technique of U.S. Pat. No. 5,190,614 is suitable for the case in which the point at which an nth peak or valley is detected in an input waveform which shows the relation between polishing time and torque change and repeats peaks and valleys is determined as an end point. However, the torque variation upon polishing of the conductive film on a wafer is suddenly increased or reduced upon polishing end. Therefore, when the box is applied, there is a problem that the polishing end point cannot be detected unless the condition that UPs or DOWNs are continuously detected n times is satisfied, and there is a possibility that the polishing end point is erroneously detected when the polishing torque of the conductive film on the wafer having an individual difference is monitored.

Furthermore, in the conventional technique described in Japanese Patent Application Laid-Open (kokai) No. 1994-315850, the sampled torque value itself or the temporal differentiation value of the torque value is compared with a set value, which is provided in advance, to detect the polishing end point. However, since there are individual differences in the conductive films on wafers, when the sampled torque value itself is compared with the set value, which is provided in advance, the polishing end point may be erroneously detected as well as the above described case.

The conventional technique of Japanese Patent Application Laid-Open (kokai) No. 1986-53728 is an end point determination method upon dry etching for a silicon oxide film or the like on a semiconductor wafer. The number of sampling is increased, and the moving average value of the actual measurement value thereof is used as a sampling value; thus, the noise components in the actual measurement values are removed, and the etching end point is detected at high precision.

Thus, a technical problem to be solved is generated in order to reliably detect polishing end at high precision without erroneous detection in the wafer state at the point of polishing end by monitoring change in the torque waveform by removing continuously varying periodic noise in real time and detecting the change in the torque waveform, which is purely caused by the wafer state, while removing the noise not caused by the wafer state such as dressing conditions and drift noise caused by the state of the polishing pad and separating the noise component.

SUMMARY OF THE INVENTION

The present invention has been proposed for achieving the above described object, and a first aspect of the present invention provides a polishing end point detection method in which an conductive film to be polished and a film of a material different from a material of the conductive film to be polished are laminated on a wafer, a polishing pad and the wafer are driven to rotate relative to each other while supplying slurry so as to chemically mechanically polish the conductive film to be polished, and polishing end of the conductive film to be polished is detected based on change in torque detected from a rotation drive source which performs the rotation drive when the conductive film to be polished is polished and removed by a predetermined thickness along with progress of the polishing and the film type is changed; wherein the detected torque is subjected to moving average processing to obtain torque input, an average value of the torque input is obtained for arbitrary n times of sampling from measurement initiation, the torque input after the average value acquisition is assumed to be relative input which is a relative value with respect to the average value, a changed amount of the relative input in each predetermined time interval is assumed to be a torque input area to obtain sum of the torque input area, and the added torque input area is compared with a threshold value which is provided in advance so as to detect the polishing end.

According to this configuration, the detected torque is subjected to moving average processing to provide torque input; therefore, the oscillation components in the detected torque comprising actual measurement values from a rotation drive source such as a motor are removed. After average value acquisition for the n times of sampling of the torque input, the torque input is assumed to be relative input which is a relative value with respect to the average value; therefore, even when differences are generated in the torque input due to individual differences in the conductive film to be polished on the wafer, influence to polishing end detection is eliminated. Then, the changed amount of the relative input in each predetermined time interval is assumed to be a torque input area of the predetermined time interval reduced to an area. When the added torque input area which is obtained by adding the torque input areas is compared with a threshold value which is provided in advance, the polishing end of the conductive film to be polished is detected while preventing erroneous detection of the polishing end, for example, in the case in which the torque input is rapidly changed or the case in which it is gently varied by a large or small amount.

A second aspect of the present invention provides the polishing end point detection method, wherein the polishing end of the conductive film to be polished is detected when the added torque input area is larger than or smaller than the threshold value depending on a material of a film below the conductive film to be polished.

According to this configuration, when the film type is changed, for example, from a Cu film to a Ta film, in comparison of the added torque input area with the threshold value, the polishing end of the Cu film is detected when the relation that the added torque input area is larger than the threshold value is achieved. When the film type is changed, for example, from a Ta film to an oxide film, the polishing end of the Ta film is detected when the relation that the added torque input area is smaller than the threshold value is achieved.

A third aspect of the present invention provides a polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection method including: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of detecting a polishing end point of the predetermined film based on change in the corrected torque waveform.

According to this configuration, friction force is large since minute irregularities are present on the surface of the predetermined film, and, correspondingly, disturbances caused by unique vibrations of various members in the polishing machine are mixed in the torque of polishing. When the data representing the torque of such polishing is subjected to Fourier transformation, periodic components in the data such as fixed periodic components generated in synchronization with the rotation of the platen motor and the head motor and the periodic components which are continuously varied in real time due to, for example, the dressing conditions such as interval dressing or in situ dressing (dressing while performing polishing) and the surface state of the polishing pad changed by the dressing can be analyzed. When the data is subjected to averaging processing by the moving average processing time of the degree of minimum necessity calculated in real time based on the analyzed periodic components, the periodic noise components are removed from the data, and a corrected torque waveform can be efficiently obtained. Then, based on change in the torque waveform, the polishing end point of the predetermined film is detected at appropriate timing.

A fourth aspect of the present invention provides a polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point-detection method including: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of calculating a first differentiation value of the corrected torque waveform and detecting the polishing end point of the predetermined film based on change in at least either a ratio of the first differentiation value in a polishing end vicinity with respect to the first differentiation value of predetermined polishing beginning or a difference between the first differentiation value in the polishing end vicinity and the first differentiation value of the predetermined polishing beginning.

According to this configuration, when at least either the ratio of the first differential value in the polishing end vicinity with respect to the first differential value of predetermined polishing beginning or the difference between the first differential value in the polishing end vicinity and the first differential value of the predetermined polishing beginning is monitored, the polishing end point of the predetermined film can be appropriately detected without being influenced by drift noise wherein the torque of polishing is reduced due to the dressing state or the like of the polishing pad.

A fifth aspect of the present invention provides a polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection method including: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of performing second differentiation of the corrected torque waveform and detecting the polishing end point of the predetermined film based on a changing point in the second differentiation waveform in the vicinity of polishing end.

According to this configuration, in most cases, the shape of the waveform of the first differentiation in the polishing end vicinity is changed from an upwardly convex and downwardly concave shape to a downwardly convex and upwardly concave shape from the changing point. When the first differentiation in such region in the polishing end vicinity is further subjected to second differentiation, the second differentiation values are changed from decrease to increase from the changing point (minimum point). Therefore, the torque waveform is subjected to second differentiation, the changing point is obtained from the point from which the second differentiation values are changed from decrease to increase, and the changing point is used as a basis; as a result, the polishing end point of the predetermined film can be appropriately detected without being influenced by the drift noise wherein the torque of polishing is reduced due to the dressing state or the like of the polishing pad.

A sixth aspect of the present invention provides the polishing end point detection method utilizing torque change according to the aspects 3, 4, or 5, wherein the measured data is subjected to Fourier transformation so as to analyze a plurality of periodic components in the data in the second step, a plurality of moving average processing time corresponding to the plurality of periodic components is calculated in the third step, and a plurality of averaging processes are performed based on the plurality of moving average processing time calculated in real time for the data so as to correct the waveform in the fourth step.

According to this configuration, in the data representing the torque of polishing, for example, the fixed periodic components generated in synchronization with, for example, rotation of the platen motor or the head motor and the periodic components which are continuously varied in real time due to the dressing conditions or the surface state or the like of the polishing pad changed by the dressing are generated. Therefore, when the data is subjected to a plurality of averaging processes by the moving average processing time of the degree of minimum necessity calculated in real time respectively for the plurality of periodic components, the torque waveform from which the plurality of periodic noise components are removed can be obtained from the data.

A seventh aspect of the present invention provides a polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection device including: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an end point detection means of detecting a polishing end point of the predetermined film based on change in the corrected torque waveform.

According to this configuration, the friction force is large since minute irregularities are present on the surface of the predetermined film, and, correspondingly, disturbances caused by unique vibrations of various members in the polishing machine are mixed in the torque of polishing measured by the torque measurement means. When the data representing such torque of polishing is subjected to Fourier transformation by the periodic component analysis means, the periodic components in the data such as the fixed periodic components generated in synchronization with the rotation of the platen motor or the head motor and the periodic components which are continuously varied in real time due to, for example, the dressing conditions or the surface state of the polishing pad hanged by the dressing are analyzed. The moving average processing time of the degree of minimum necessity is calculated in real time based on the periodic components analyzed by the average processing time calculation means, and the data is subjected to averaging processing by the moving average processing time calculated in real time by the average processing means; as a result, the corrected torque waveform from which the periodic noise components are removed can be efficiently obtained from the data. Then, the polishing end point of the predetermined film is detected at appropriate timing based on the change in the torque waveform corrected by the end point detection means.

An eighth aspect of the present invention provides a polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection device including: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an end point detection means of calculating a first differentiation value of the corrected torque waveform and detecting the polishing end point of the predetermined film based on change in at least either a ratio of the first differentiation value in a polishing end vicinity with respect to the first differentiation value of predetermined polishing beginning or a difference between the first differentiation value in the polishing end vicinity and the first differentiation value of the predetermined polishing beginning.

According to this configuration, when the first differential value of the corrected torque waveform is calculated, and at least either the ratio of the first differential value in the polishing end vicinity with respect to the first differential value of the predetermined polishing beginning or the difference between the first differential value in the polishing end vicinity and the first differential value of the predetermined polishing beginning is monitored, the polishing end point of the predetermined film is appropriately detected without being influenced by the drift noise wherein the torque of polishing reduced due to the dressing state or the like of the polishing pad.

A ninth aspect of the present invention provides a polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection device including: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an endpoint detection means of performing second differentiation of the corrected torque waveform and detecting the polishing end point of the predetermined film based on a changing point in the second differentiation waveform in the vicinity of polishing end.

According to this configuration, the corrected torque waveform is subjected to second differentiation by the end point detection means, the changing point from which the second differentiation values are changed from decrease to increase is obtained, and the changing point is used as a basis; as a result, the polishing end point of the predetermined film is appropriately detected without being influenced by the drift noise wherein the torque of polishing is reduced due to the surface state or the like of the polishing pad.

A tenth aspect of the present invention provides the polishing end point detection device utilizing torque change according to the aspect 7, 8, or 9, wherein the measured data is subjected to Fourier transformation so as to analyze a plurality of periodic components in the data by the periodic component analysis means, a plurality of moving average processing time corresponding to the plurality of periodic components is calculated by the average processing time calculation means, and a plurality of averaging processes are performed based on the plurality of moving average processing time calculated in real time for the data so as to correct the waveform by the average processing means.

According to this configuration, in the data representing the torque of polishing measured by the torque measurement means, a plurality of periodic components such as fixed periodic components generated in synchronization with rotation or the like of the platen motor or the head motor and the periodic components which are continuously varied in real time due to, for example, the dressing conditions or the surface state of the polishing pad changed by the dressing are generated. Therefore, the moving average processing time is calculated in real time for the plurality of periodic components by the average processing time calculation means, and the average processing means subjects the data to a plurality of averaging processes by the moving average processing time calculated in real time; as a result, the torque waveform from which the plurality of periodic noise components are removed is obtained from the data.

In the first aspect of the present invention, the detected torque is subjected to moving average processing to obtain torque input, an average value of the torque input is obtained for arbitrary n times of sampling from measurement initiation, the torque input after the average value acquisition is assumed to be relative input which is a relative value with respect to the average value, a changed amount of the relative input in each predetermined time interval is assumed to be a torque input area to obtain sum of the torque input area, and the added torque input area is compared with a threshold value which is provided in advance; therefore, since the torque input serves as relative input with respect to the average value, influence to the polishing end detection is eliminated even when there is a difference in the torque input due to an individual difference of the conductive film to be polished on the wafer, and erroneous detection can be prevented. The changed amount in the relative input in each predetermined time interval is assumed as a torque input area, and, when the added torque input area, which is obtained by adding the torque input areas, is compared with a threshold value, there is an advantage that the polishing end can be reliably detected in real time with a small calculation amount.

In a second aspect of the present invention, the polishing end of the conductive film to be polished is detected when the added torque input area is larger than or smaller than the threshold value depending on a material of a film below the conductive film to be polished. Therefore, there is an advantage that the polishing end point can be reliably detected by capturing the case in which the added torque input area is changed to be larger or smaller than a threshold value depending on the laminated film type.

The third aspect of the present invention includes: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of detecting a polishing end point of the predetermined film based on change in the corrected torque waveform. Therefore, when the fixed periodic components and the periodic components which are continuously varied in real time due to, for example, the dressing conditions or the surface state of the polishing pad are analyzed, and the data representing the torque of polishing is subjected to averaging processing by the moving average processing time calculated in real time based on the analyzed periodic components, the torque waveform from which the periodic noise components are removed can be efficiently obtained. There is an advantage that the polishing end point of the predetermined film can be reliably detected at high precision based on the change in the torque waveform.

The fourth aspect of the present invention includes: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of calculating a first differentiation value of the corrected torque waveform and detecting the polishing end point of the predetermined film based on change in at least either a ratio of the first differentiation value in a polishing end vicinity with respect to the first differentiation value of predetermined polishing beginning or a difference between the first differentiation value in the polishing end vicinity and the first differentiation value of the predetermined polishing beginning. Therefore, there is an advantage that the polishing end point of the predetermined film can be detected at high precision without being influenced by the drift noise wherein the torque of polishing is reduced due to the dressing state or the like of the polishing pad.

The fifth aspect of the present invention includes: a first process of measuring a torque or an index corresponding to the torque; a second process of analyzing a periodic component in the data by subjecting Fourier transformation to the measured data; a third process of calculating moving average processing time for removing a periodic noise component based on the periodic component; a fourth process of correcting a waveform by performing averaging process based on the moving average processing time calculated in real time for the data; and a fifth process of performing second differentiation of the corrected torque waveform and detecting the polishing end point of the predetermined film based on a changing point in the second differentiation waveform in the vicinity of polishing end. Therefore, when the changing point is obtained by subjecting second differentiation to the torque waveform, and the changing point is used as a basis, there is an advantage that the polishing end point of the predetermined film can be reliably detected at high precision without being influenced by the drift noise wherein the torque of the polishing is reduced due to, for example, the dressing state of the polishing pad.

In the sixth aspect of the present invention, the measured data is subjected to Fourier transformation so as to analyze a plurality of periodic components in the data in the second step, a plurality of moving average processing time corresponding to the plurality of periodic components is calculated in the third step, and a plurality of averaging processes are performed based on the plurality of moving average processing time calculated in real time for the data so as to correct the waveform in the fourth step. Therefore, in the case in which the data representing the torque of the polishing includes the plurality of periodic components such as the fixed periodic components and the periodic components which are continuously varied in real time, when it is subjected to a plurality of averaging processes by the moving average time respectively calculated in real time for the plurality of periodic components, there is an advantage that the torque waveform from which the plurality of periodic noise components are removed can be efficiently obtained from the data.

The seventh aspect of the present invention includes: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an endpoint detection means of detecting a polishing end point of the predetermined film based on change in the corrected torque waveform. Therefore, the torque waveform from which the periodic noise components are removed can be efficiently obtained when the fixed periodic components and the periodic components which are continuously varied in real time are analyzed by the periodic component analysis means, the moving average processing time is calculated in real time by the average processing time calculation means based on the analyzed periodic components, and the data representing the torque of polishing is subjected to averaging processing by the average processing means by the moving average processing time calculated in real time. There is an advantage that the polishing end point of the predetermined film can be reliably detected at high precision based on change in the torque waveform by the end point detection means.

The eighth aspect of the present invention includes: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an end point detection means of calculating a first differentiation value of the corrected torque waveform and detecting the polishing end point of the predetermined film based on change in at least either a ratio of the first differentiation value in a polishing end vicinity with respect to the first differentiation value of predetermined polishing beginning or a difference between the first differentiation value in the polishing end vicinity and the first differentiation value of the predetermined polishing beginning. Therefore, when at least either the ratio of the first differentiation value in the polishing end vicinity with respect to the first differentiation value of the predetermined polishing beginning or the difference between the first differentiation value in the polishing end vicinity and the first differentiation value of the predetermined polishing beginning is monitored by the end point detection means, there is an advantage that the polishing end point of the predetermined film can be reliably detected at high precision without being influenced by the drift noise wherein the torque of polishing is reduced.

The ninth aspect of the present invention includes: a torque measurement means of measuring a torque or an index corresponding to the torque; a periodic component analysis means of analyzing a periodic component in the data by subjecting Fourier transformation to the measured data; an average processing time calculation means of calculating moving average processing time for removing a periodic noise component based on the analyzed periodic component; an average processing means of correcting a waveform by performing averaging process based on the moving average processing time calculated in real time for the data; and an endpoint detection means of performing second differentiation of the corrected torque waveform and detecting the polishing end point of the predetermined film based on a changing point in the second differentiation waveform in the vicinity of polishing end. Therefore, when the changing point is obtained by subjecting second differentiation to the torque waveform by the end point detection means, and the changing point is used as a basis, there is an advantage that the polishing end point of the predetermined film can be reliably detected at high precision without being influenced by the drift noise wherein the torque of polishing is reduced.

In the tenth aspect of the present invention, the measured data is subjected to Fourier transformation so as to analyze a plurality of periodic components in the data by the periodic component analysis means, a plurality of moving average processing time corresponding to the plurality of periodic components is calculated by the average processing time calculation means, and a plurality of averaging processes are performed based on the plurality of moving average processing time calculated in real time for the data so as to correct the waveform by the average processing means. Therefore, in the case in which the data representing the torque of the polishing measured by the torque measurement means includes the plurality of periodic components such as the fixed periodic components and the periodic components which are continuously varied in real time, when the moving average processing time is calculated in real time respectively for the plurality of periodic components, and the data is subjected to a plurality of averaging processes by the average processing means by the moving average processing time calculated in real time, there is an advantage that the torque waveform from which the plurality of periodic noise components are removed can be efficiently obtained from the data.

BRIEF DESCRIPTION OF THE DRAWINGS

FIG. 3(a) to 3(d) are waveform diagrams showing data examples representing the torque of polishing, the torque waveform obtained by subjecting the data to averaging processing, or the like, wherein FIG. 3(a) is a waveform diagram of a data example representing torque of polishing, FIG. 3(b) is a waveform diagram showing an analysis result example of periodic components analyzed from the data of FIG. 3(a), FIG. 3(c) is a waveform diagram showing a torque waveform obtained by subjecting the data of FIG. 3(a) to averaging processing, and FIG. 3(d) is a waveform diagram showing an analysis result example of the periodic noise components of the torque waveform of FIG. 3(c);

FIG. 4(a) to 4(c) are diagrams for explaining the method of detecting the polishing end point based on change in the torque waveform, wherein FIG. 4(a) is a waveform diagram showing torque waveform examples which are varied under influence of drift noise due to differences in dressing methods, FIG. 4(b) is a diagram explaining an example of the method of detecting the polishing end point by subjecting the torque waveforms of FIG. 4(a) to first differentiation, and FIG. 4(c) is a diagram for explaining examples of the method of detecting the polishing end point by subjecting the torque waveform of FIG. 4(a) to second differentiation;

FIGS. 8(a) and 8(b) are diagrams for explaining a comparative example of FIG. 7, wherein FIG. 8(a) is a diagram showing a calculation method of an added area, and FIG. 8(b) is a diagram showing an example of change of torque input.

DETAILED DESCRIPTION OF THE PREFERRED EMBODIMENTS

Figure 1:
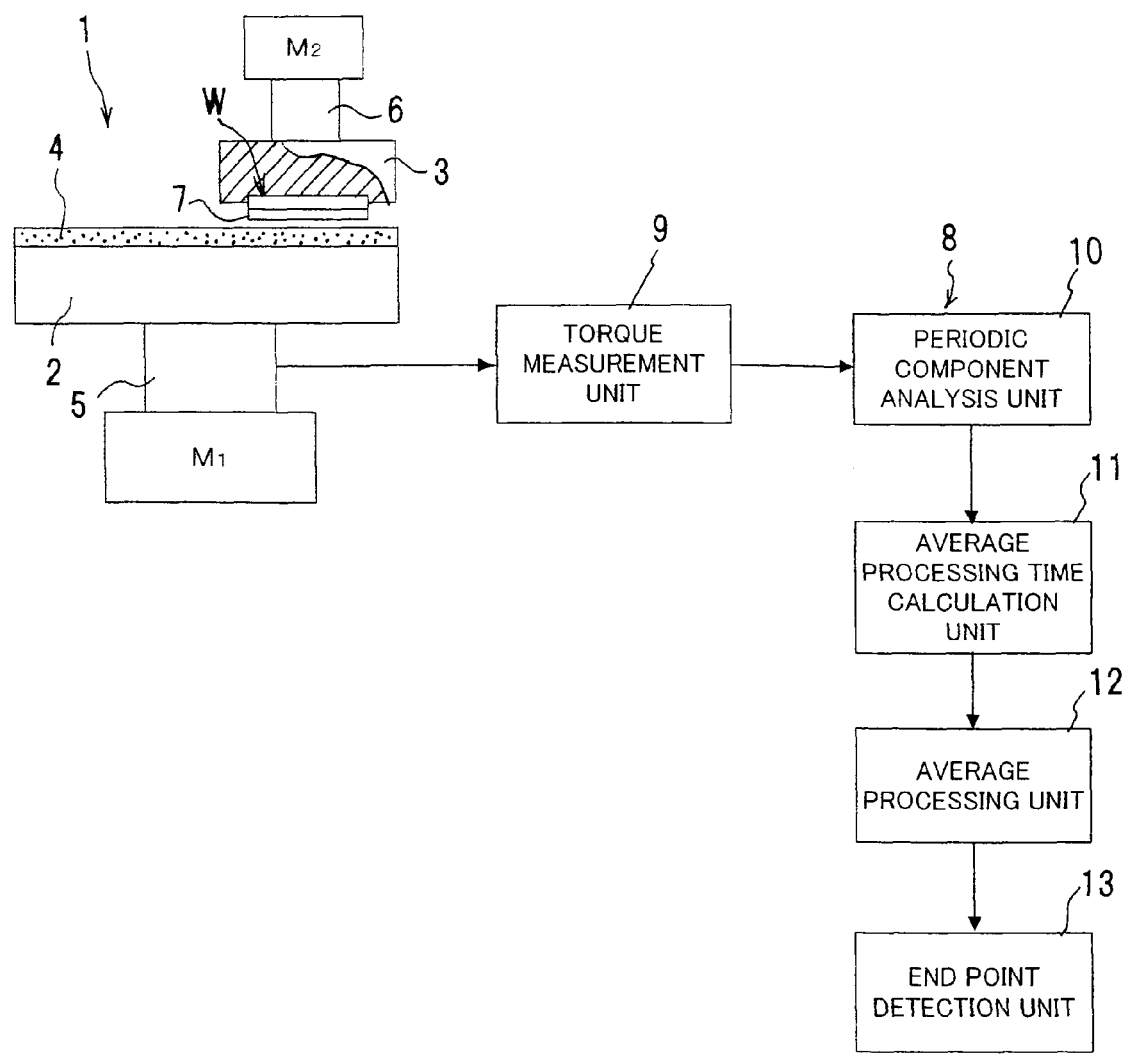
FIG. 1 is a block diagram of a schematic configuration of a chemical mechanical polishing device and a polishing end point detection device.

Hereinafter, a preferred embodiment of the present invention will be described in detail with reference to drawings. First of all, a configuration of a polishing end point detection device which is according to the present embodiment and utilizing torque change will be described. FIG. 1 is a block diagram of a schematic configuration of a chemical mechanical polishing device and the polishing end point detection device.

In FIG. 1, the chemical mechanical polishing device 1 is mainly composed of a platen 2 and a polishing head 3. The platen 2 is formed into a disk-like shape, a polishing pad 4 is attached to the upper surface thereof, and a platen motor $M_1$ serving as a rotation drive source is coupled to the center of the lower surface thereof via a platen rotating shaft 5. The polishing head 3 is formed into a disk-like shape smaller than the platen 2 side and a head motor $M_2$ serving as a rotation drive source is coupled to the center of the upper surface thereof via a head rotating shaft 6.

The chemical mechanical polishing device 1 retains a wafer W by the polishing head 3, brings a predetermined conductive film 7 on the wafer W (lower side in FIG. 1) into contact with a pressure with the polishing pad 4 while supplying slurry onto the polishing pad 4 from an unshown nozzle, and rotates the platen 2 and the polishing head 3 in this state by the platen motor $M_1$ and the head motor $M_2$, respectively, thereby chemically mechanically polishing the predetermined conductive film 7 on the wafer W.

A torque measurement unit 9 serving as a torque measurement means of the polishing end point detection device 8 is attached to the part of the platen rotating shaft 5. The torque measurement unit 9 measures the data showing the torque of polishing of the predetermined conductive film 7 by the torque of the platen rotating shaft 5. Note that, measurement of the data showing the torque of polishing may be performed by measurement of the torque of the head rotating shaft 6 or measurement of the index corresponding to the torque such as a current that flows through the platen motor $M_1$ or the head motor $M_2$ instead of measurement of the torque of the platen rotating shaft 5.

In the polishing endpoint detection device 8, in addition to the torque measurement unit 9, subsequent to the torque measurement unit 9, a periodic component analysis unit 10 serving as a periodic component analysis means which subjects Fourier transformation to the measured data and analyzes periodic components in the data, an average processing time calculation unit 11 serving as an average processing time calculation means which calculates the moving average processing time for removing periodic noise components based on the analyzed periodic components, an average processing unit 12 serving as an average processing means which subjects the data to averaging processing based on the moving average processing time calculated in real time and corrects the waveform, and an end point detecting unit 13 serving as an end point detecting means which detects the polishing end point of the predetermined film based on the change in the corrected torque waveform are sequentially connected.

Next a polishing end point detection method using the above-configured polishing end point detection device will be described in the order of "removal of periodic noise components from the data representing measured toque of polishing" and "detection of the polishing end point according to the torque waveform from which the periodic noise components are removed".

Figure 2:
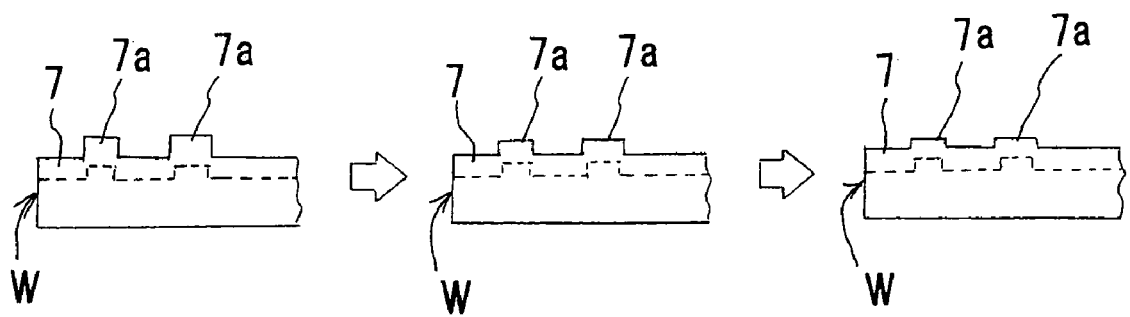
FIG. 2 is a drawing for explaining the state that minute irregularities on the wafer surface are planarized along with progress of polishing.
Figure 3A:
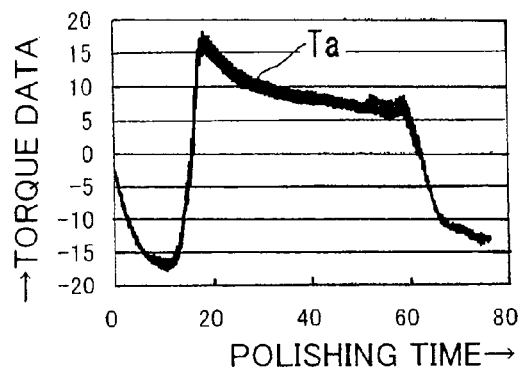
Figure 3C:
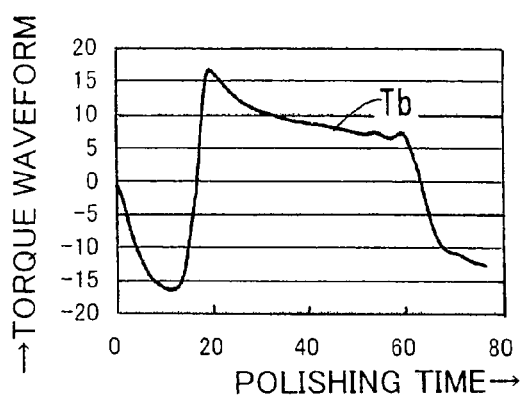
Figure 3B:
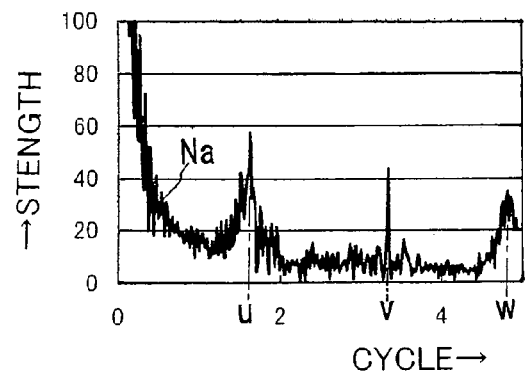
Figure 3D:
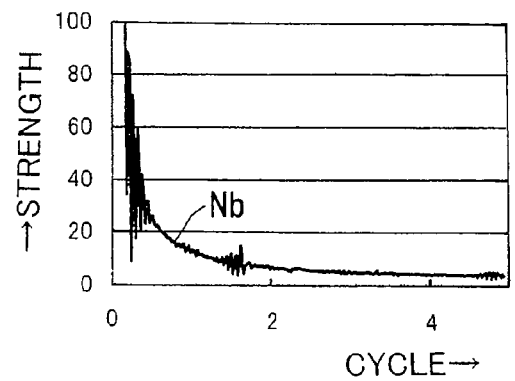

"Removal of periodic noise components from the data representing measured toque of polishing" will be described with reference to FIG. 2 and FIG. 3(a) to 3(d). FIG. 2 is a drawing for explaining the state that minute irregularities on the wafer surface are planarized along with progress of polishing. FIG. 3(a) to 3(d) are waveform diagrams showing data examples representing the torque of polishing, the torque waveform obtained by subjecting the data to averaging processing or the like, wherein FIG. 3(a) is a waveform diagram of a data example representing torque of polishing, FIG. 3(b) is a waveform diagram showing an analysis result example of periodic components analyzed from the data of FIG. 3(a), FIG. 3(c) is a waveform diagram showing a torque waveform obtained by subjecting the data of FIG. 3(a) to averaging processing, and FIG. 3(d) is a waveform diagram showing an analysis result example of the periodic noise components of the torque waveform of FIG. 3(c).

On the surface of the predetermined conductive film 7 on the wafer W applied in the present embodiment, minute protrusion portions 7a, 7a, . . . are present as shown in FIG. 2, and the chemical mechanical polishing device 1 is to form multi-layer wiring or the like by polishing/removing and planarizing the conductive film 7 having the minute protrusion portions 7a, 7a, . . . on the surface thereof. Therefore, the friction force in the process of planarizing the minute protrusion portions 7a, 7a, . . . shown in FIG. 2 is large, and, correspondingly, disturbances caused by unique vibration or the like of various devices and members including the platen motor $M_1$ and the head motor $M_2$ in the chemical mechanical polishing device 1 are mixed in the data representing the torque of polishing measured by the torque measurement unit 9.

FIG. 3(a) shows torque data Ta measured by the torque measurement unit 9. In the torque data Ta, a plurality of periodic noise components corresponding to, for example, fixed periodic components generated in synchronization of the rotation of the platen motor $M_1$ or the head motor $M_2$ in the chemical mechanical polishing device 1 and periodic components which are continuously varied in real time due to the surface state or the like of the polishing pad changed by dressing conditions or dressing are mixed. Therefore, it is difficult to detect the polishing end point of the predetermined conductive film 7 at high precision by directly using the torque data Ta and according to the change thereof.

Therefore, in the present embodiment, first of all, the torque data Ta is subjected to Fourier transformation, thereby analyzing the plurality of periodic components generated in the torque data Ta. The moving average processing time corresponding to the respective periodic components at least required for removing the plurality of periodic noise components is calculated in real time from the analyzed plurality of periodic components. Then, when the torque data Ta is subjected to a plurality of averaging processes for the moving average processing time corresponding to the each periodic components in real time, a torque waveform Tb from which the plurality of periodic noise components are removed is obtained.

FIG. 3(b) shows a plurality of periodic components analyzed by subjecting the torque data Ta to Fourier transformation by the periodic component analysis unit 10. In the waveform of a periodic noise component Na including the plurality of periodic components, a u-second-cycle periodic noise component, a v-second-cycle periodic noise component, a w-second-cycle periodic noise component or the like are present as periodic noise components having particularly large intensities. Then, the average processing time calculation unit 11 calculate, in real time, the minimum moving average processing time corresponding to the each periodic components required for removing the plurality of periodic noise components from these periodic components, that is, the u-second periodic component, the v-second periodic component, the w-second periodic component or the like. The minimally required moving average processing time is the time slightly longer than the respective period of the plurality of periodic noise components.

FIG. 3(c) shows the torque waveform Tb obtained by subjecting the torque data Ta to a plurality of averaging processes with respect to the moving average processing time calculated in real time corresponding to the each periodic components. FIG. 3(d) shows the waveform of a periodic noise component Nb analyzed by subjecting the torque waveform Tb to Fourier transformation. A plurality of periodic noise components including the periodic noise components having large intensities are removed from the waveform of the noise component Nb.

Figure 4A:
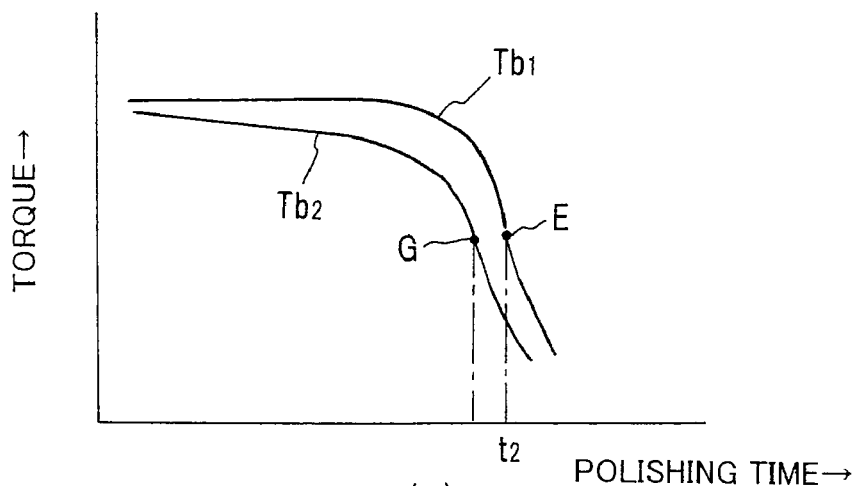
Figure 4B:
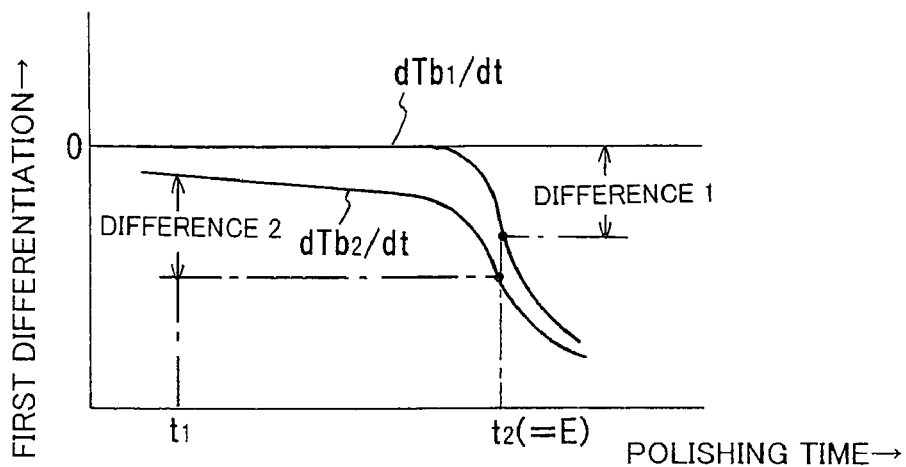
Figure 4C:
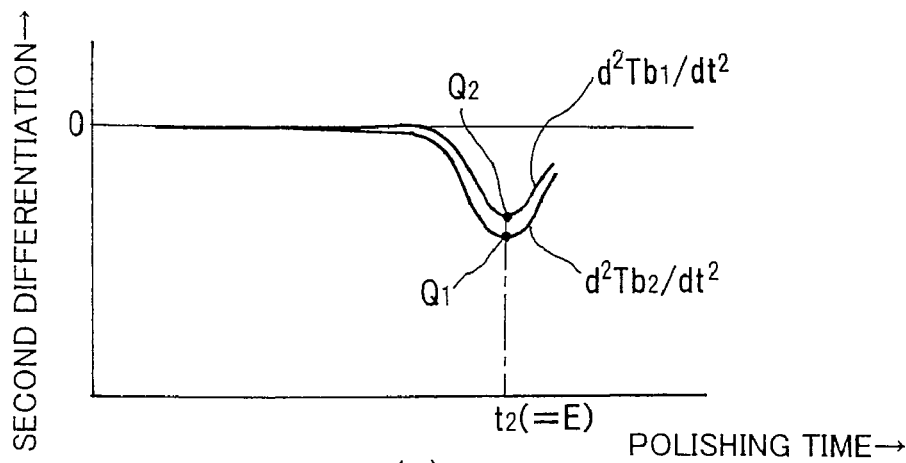

Next, "detection of the polishing end point according to the torque waveform from which the periodic noise components are removed" will be explained with reference to FIG. 4(a) to 4(c). FIG. 4(a) to 4(c) are diagrams for explaining the method of detecting the polishing end point based on change in the torque waveform. FIG. 4(a) is a waveform diagram showing torque waveform examples which are varied under influence of drift noise due to differences in dressing methods, FIG. 4(b) is a diagram explaining an example of the method of detecting the polishing end point by subjecting the torque waveforms of FIG. 4(a) to first differentiation, and FIG. 4(c) is a diagram for explaining examples of the method of detecting the polishing end point by subjecting the torque waveform of FIG. 4(a) to second differentiation.

The method of detecting the polishing end point by subjecting the torque waveforms Tb to first differentiation will be described with reference to FIGS. 4(a) and 4(b). In FIG. 4(a), $Tb_1$ is the torque waveform of the case on in situ dressing wherein dressing of the polishing pad is performed while performing polishing, and $Tb_2$ is the torque waveform of the case of interval dressing wherein dressing of the polishing pad is performed before polishing. In the case of interval dressing, since dressing is not performed during polishing, slightly but gradually clogging progresses in the surface state of the polishing pad during polishing. As a result, the torque waveform $Tb_2$ of the case of interval dressing is gradually reduced as shown in the diagram under the influence of drift noise.

Therefore, when the point the torque waveform reaches, for example, predetermined inclination (first differentiation value) is set as a detection point of polishing end, the waveform reaches the predetermined inclination (first differentiation value) at a point E in the case of the torque waveform $Tb_1$ which is not under the influence of drift noise, and the point E is detected as a polishing end point. On the other hand, in the case of the torque waveform $Tb_2$ which is under the influence of the drift noise, the waveform reaches the predetermined inclination (first differentiation value) at a point G, and detection is erroneously performed while the correct polishing end point is the point E.

Therefore, in the present embodiment, as shown in FIG. 4(b), first of all, both the torque waveforms are subjected to first differentiation, thereby obtaining the waveform of the first differentiation ($dTb_1/dt$) with respect to the torque waveform $Tb_1$ and the waveform of the first differentiation ($dTb_2/dt$) with respect to the torque waveform $Tb_2$. Then, in the manner described below, with respect to both the first differentiation values, the ratio of the first differentiation value of a polishing end vicinity $t_2$ (wherein, t2 in FIG. 4(b) is equivalent to the point E) with respect to the first differentiation value of predetermined polishing beginning $t_1$, in other words $$(dTb_1/dt)_{t2}/(dTb_1/dt)_{t1} \tag{1}$$

$$(dTb_2/dt)_{t2}/(dTb_2/dt)_{t1} \tag{2}$$

are monitored. The values of the above described expressions (1) and (2) are approximately equal to each other. As a result, the polishing end point E of the predetermined conductive film can be correctly detected without being influenced by the drift noise wherein the torque of polishing is reduced due to the dressing state or the like of the polishing pad.

Moreover, as in the manner described below, the differences between the first differentiation values of the polishing end vicinity $t_2$ and the first differentiation values of the predetermined polishing beginning $t_1$, in other words $$(dTb_1/dt)_{t2}-(dTb_1/dt)_{t1} \tag{3}$$

$$(dTb_2/dt)_{t2}-(dTb_2/dt)_{t1} \tag{4}$$

are monitored. The values of the above described expressions (3) and (4) are approximately equal to each other. As a result, as well as the case in which the relation between the above described expressions (1) and (2) is used, the polishing end point E of the predetermined conductive film can be correctly detected without being influenced by the drift noise wherein the torque of polishing is reduced due to, for example, the dressing state of the polishing pad.

A method of detecting the polishing end point by subjecting the torque waveform Tb to second differentiation will be described with reference to FIG. 4(c). Instead of the method in which the polishing end point is detected by subjecting the torque waveform Tb to first differentiation, in the manner described below, the polishing end point of the predetermined conductive film can be detected based on changing points obtained by second differentiation of the torque waveforms $Tb_1$ and $Tb_2$.

More specifically, the shape of both the waveforms of the first differentiation ($dTb_1/dt$) and ($dTb_2/dt$) in the polishing end vicinity $t_2$ is changed from an upward convex and downwardly concave shape to a downwardly convex and upwardly concave shape from changing points $Q_1$ and $Q_2$ approximately equal to the position of the E point in most cases. When the waveforms of the first differentiation in the region of the polishing end vicinity $t_2$ are further subjected to second differentiation ($d^2Tb_1/dt^2$) and ($d^2Tb_2/dt^2$), respectively, the values of the second differentiation ($d^2Tb_1/dt^2$) and ($d^2Tb_2/dt^2$) are changed from decrease to increase from the changing points (minimum points) $Q_1$ and $Q_2$ as shown in FIG. 4(C). Therefore, the torque waveforms $Tb_1$ and $Tb_2$ are subjected to the second differentiation ($d^2Tb_1/dt^2$) and ($d^2Tb_2/dt^2$), and the changing pints $Q_1$ and $Q_2$ are obtained from the points from which the values of the second differentiation are changed from decrease to increase. Based on the changing points $Q_1$ and $Q_2$, as well as the above described case, the polishing end point E of the predetermined conductive film can be correctly detected without being influenced by the drift noise wherein the torque of polishing is reduced due to, for example, the dressing state of the polishing pad.

When the polishing end point E is detected by any of the above described methods, detecting the moment when the predetermined conductive film is completely removed as the polishing end point E is difficult. Therefore, when over-polish time is provided by another parameter and the polishing process is terminated after polishing is continued for certain time from the end detected in the present algorithm, complete removal of the predetermined conductive film can be ensured.

As described above, in the polishing end point detection method according to the present embodiment utilizing torque change and the device thereof, when the torque data Ta is subjected to a plurality of averaging processes by the moving average processing time respectively calculated in real time for the plurality of periodic components, the torque waveform Tb from which the plurality of periodic components are removed can be efficiently obtained.

The torque waveform Tb is subjected to first differentiation, and at least change of either the ratio of the first differentiation value in the polishing end vicinity $t_2$ with respect to the first differentiation value of the predetermined polishing beginning $t_1$ or the difference between the first differentiation value in the polishing end vicinity $t_2$ and the first differentiation value of the predetermined polishing beginning $t_1$ is monitored; therefore, the polishing end point E of the predetermined conductive film 7 can be reliably detected without being influenced by the drift noise wherein the torque of polishing is reduced due to, for example, the dressing state of the polishing pad 4.

The torque waveform Tb is subjected to second differentiation to obtain the changing point Q, and the changing point Q is used as a basis; therefore, as well as the case described above, the polishing end point E of the predetermined conductive film 7 can be reliably detected at high precision without being influenced by the drift noise wherein the torque of polishing is reduced due to, for example, the dressing state of the polishing pad 4.

Figure 5:
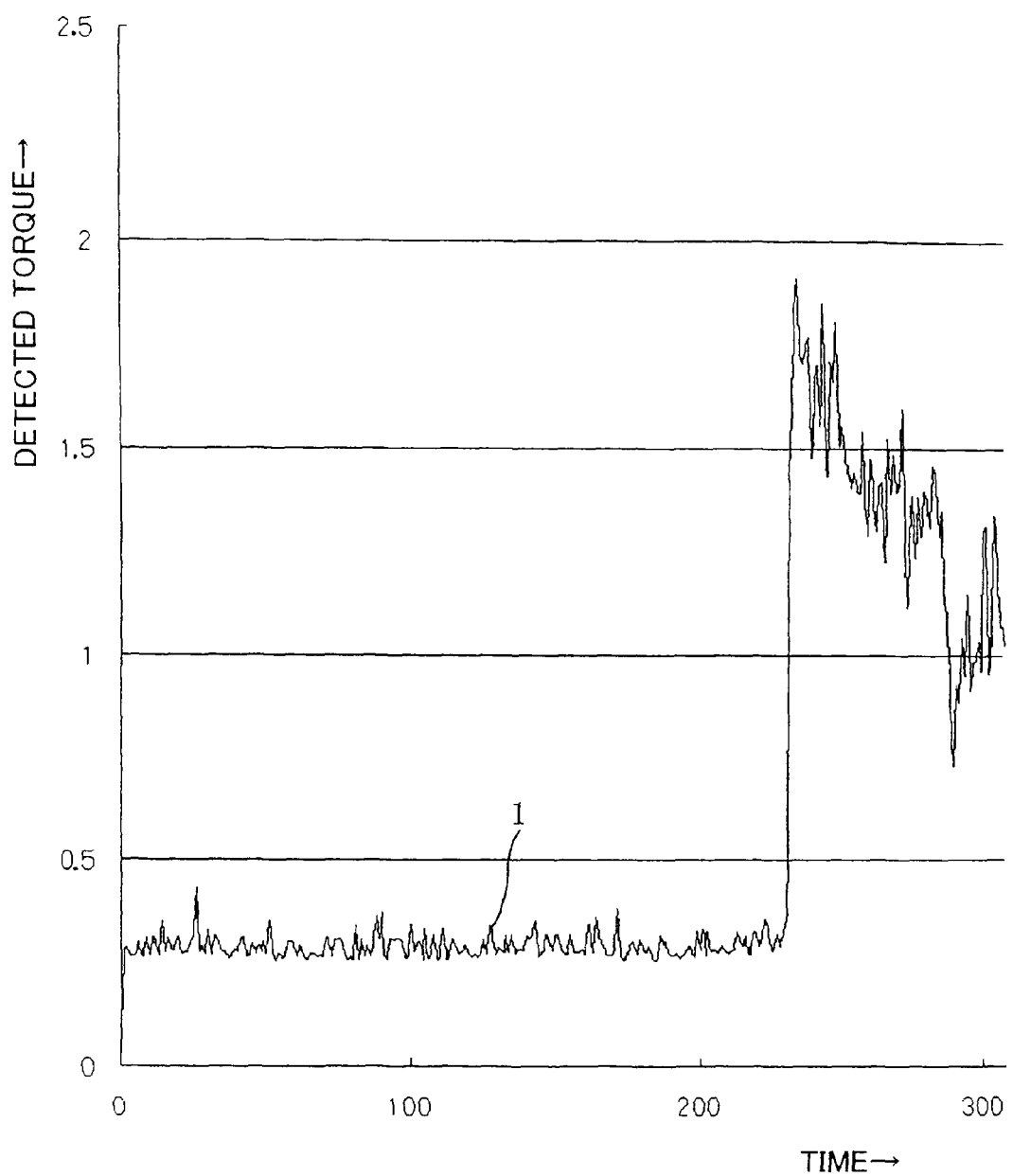
FIG. 5 is a waveform diagram showing an example of change of detected torque along with progress of polishing.
Figure 6:
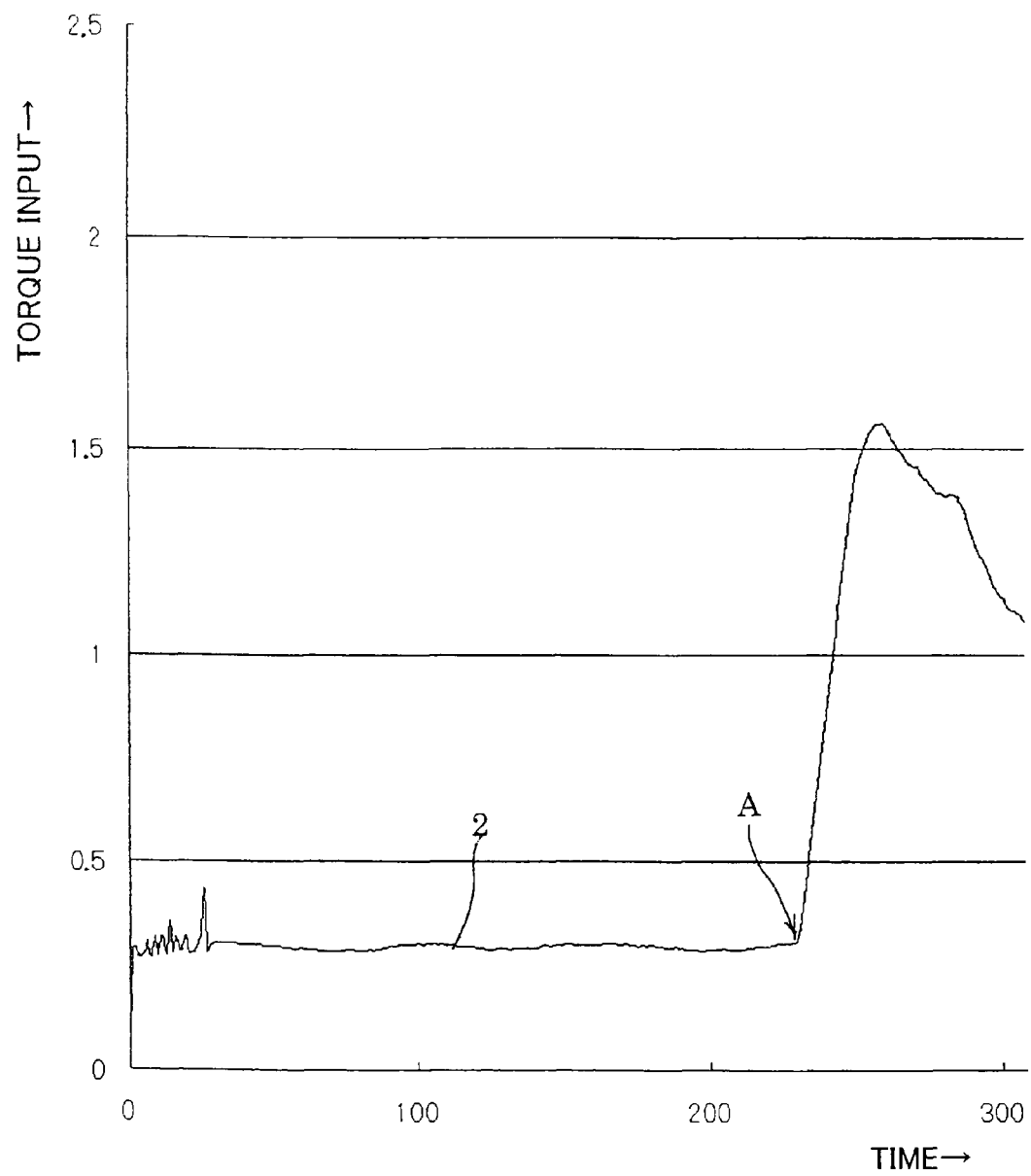
FIG. 6 is a waveform diagram showing torque input wherein detected torque has undergone moving average processing.
Figure 7:
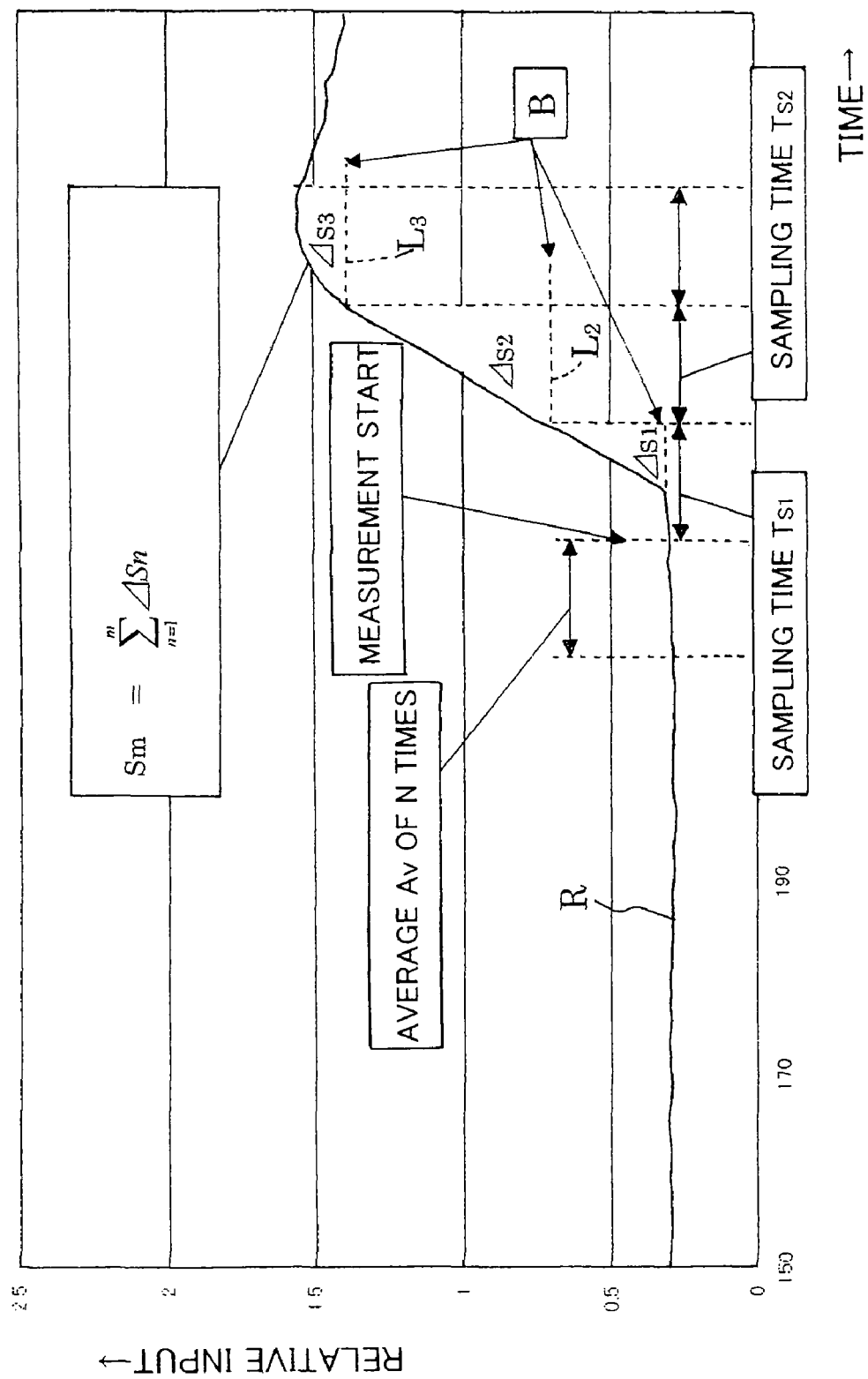
FIG. 7 is a diagram for explaining a calculation method of a torque input area and added torque input area.
Figure 8A:
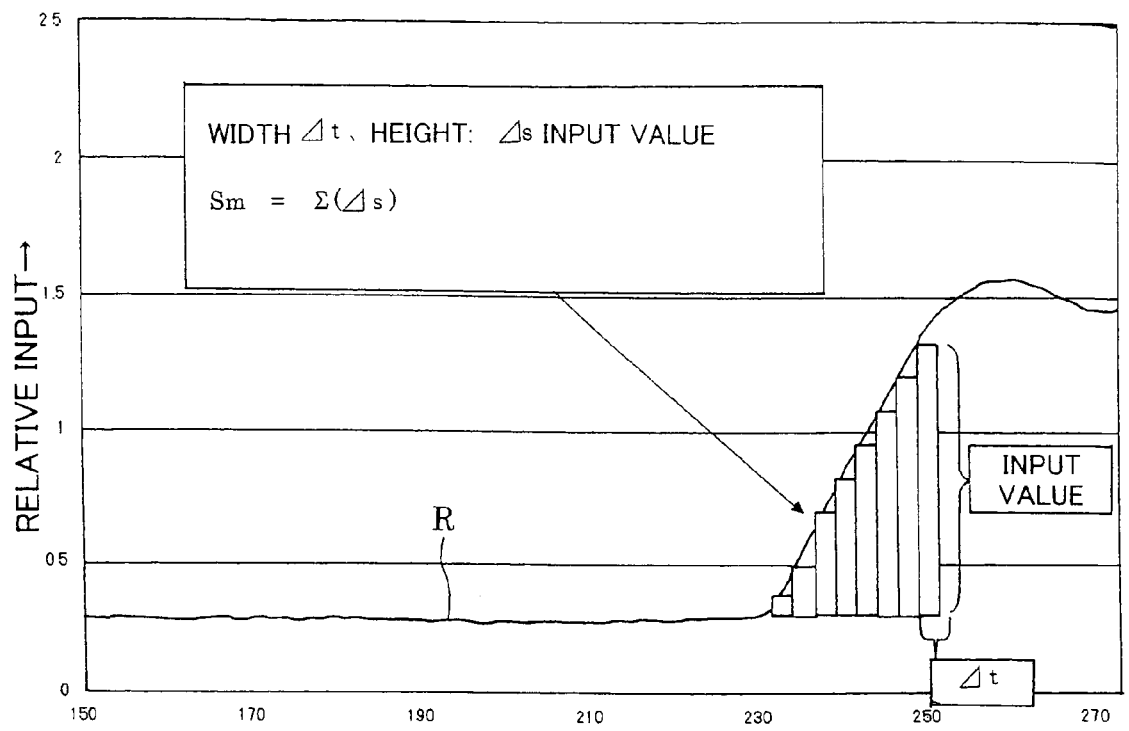
Figure 8B:
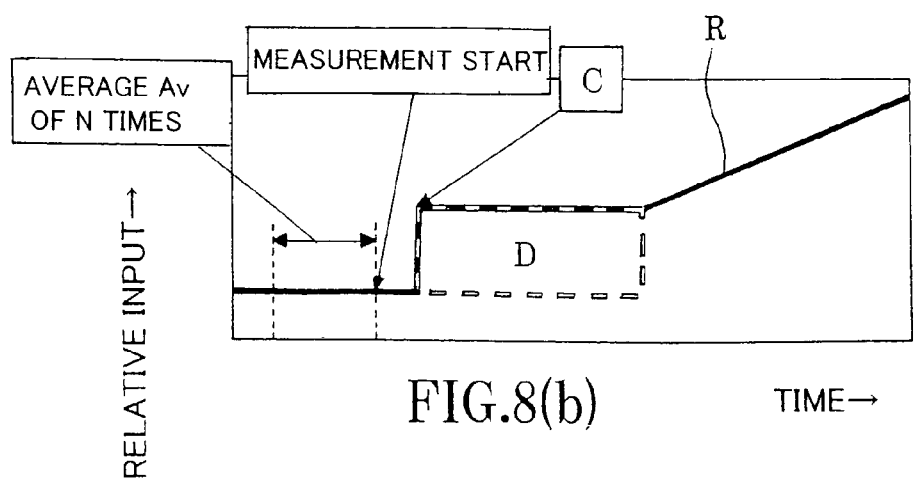

Next, another embodiment of the present invention will be described in detail with reference to drawings. FIG. 5 is a waveform diagram showing an example of change of detected torque along with progress of polishing, FIG. 6 is a waveform diagram showing torque input wherein detected torque has undergone moving average processing, FIG. 7 is a diagram for explaining a calculation method of a torque input area and added torque input area, and FIGS. 8(a) and 8(b) are diagrams for explaining a comparative example of FIG. 7, wherein FIG. 8(a) is a diagram showing a calculation method of an added area, and FIG. 8(b) is a diagram showing an example of change of torque input.

The polishing end point detection method according to the present embodiment will be described. In a wafer applied to the present embodiment, a Ta film serving as a barrier layer is laminated via an oxide film on the wafer composed of semiconductor, and a conductive film composed of Cu to be polished is laminated on the Ta film. In other words, in the wafer sample, the conductive film to be polished and the film of a material that is different from the conductive film to be polished are laminated on the wafer.

A chemical mechanical polishing device which polishes and removes the conductive film to be polished is mainly composed of a platen and a polishing head. The platen is formed into a disk-like shape, a polishing pad is attached to the upper surface thereof, and a platen-side motor serving as a rotation drive source is coupled to the center of the lower surface thereof via a rotating shaft. The polishing head is formed into a disk-like shape smaller than the platen side, and a head-side motor serving as a rotation drive source is coupled to the center of the upper surface thereof via a rotating shaft.

The chemical mechanical polishing device retains the wafer by the polishing head, brings the wafer into contact with a pressure with the polishing pad while supplying slurry from the nozzle onto the polishing pad, and rotates the platen and the polishing head in this state by the platen-side motor and the head-side motor, respectively, thereby subjecting the conductive film to be polished on the wafer to chemical mechanical polishing.

FIG. 5 shows detected torque 1 which is directly detected from either the platen-side motor or the head-side motor. The detected torque 1 is violently vibrated as shown in the drawing. The detected torque 1 is subjected to a publicly known moving average process, thereby obtaining torque input 2 shown in FIG. 6. The degree of the moving average can be arbitrarily adjusted as long as torque variation at polishing end is not disturbed, and the vibration components can be suppressed as shown in the drawing when it is processed by moving average of about ten degrees.

A point A in FIG. 6 is the point from which the torque input 2 is started to change due to the change in the film type along with progress of polishing. In this manner, the torque input 2 upon film-type change is rapidly changed.

Herein, in the analysis for polishing end detection, instead of using the absolute values of the torque input 2, as shown in FIG. 7 which will be described later, an average value Av of the torque input 2 of an arbitrary n times of sampling from measurement initiation is obtained, the average value Av is set as zero, the torque input 2 after acquisition of the average value is relative input R serving as relative values with respect to the average value Av, and analysis is performed by using the relative input R. Since the relative input R is used in analysis, the influence imposed on the analysis result is removed even when there are differences in the torque input 2 due to individual differences of the conductive film on the wafer.

The torque that rotates the polishing pad or the wafer is not dependent on the film thickness of the conductive film to be polished, but is approximately constant before and after the conductive film to be polished is completely removed. Therefore, the relative input R before the film thickness is changed has a small value close to zero.

The change amount of the relative input R in each predetermined time interval (this will be referred to as sampling time $T_s$ as a matter of convenience) is assumed to be a torque input area $\Delta s$ of each sampling time $T_s$ converted into an area. The polishing end of the conductive film to be polished is detected by comparing an added torque input area Sm, which is obtained by adding the torque input areas $\Delta s$, with a threshold value Sth provided in advance.

The calculation method of the torque input area $\Delta s$ and the added torque input area Sm will be described with reference to FIG. 7. After time $T_{s1}$ is elapsed, as shown by B in the drawing, an auxiliary line $L_2$ is added at the height of the vertical axis in the drawing when sampling is started. After time $T_{s2}$ is elapsed, a torque input area $A_{s2}$ between the auxiliary line $L_2$ and the waveform of the relative input R is obtained. After the time $T_{s2}$ is elapsed, an auxiliary line $L_3$ is added. After time $T_{s3}$ is elapsed, a torque input area $A_{s3}$ between the auxiliary line $L_3$ and the relative input R is obtained.

Then, as shown in the expression (1), the above described torque input areas $\Delta_{s1}, \Delta_{s2}, \Delta_{s3}, \ldots$ are added to obtain the added torque input area Sm.

$$Sm = \sum_{n=1}^{m} \Delta s_0 \qquad (1)$$

The polishing end of the conductive film to be polished is detected by comparing the added torque input area Sm with the threshold value Sth which is provided advance. As described above, the relative input R before the film type is changed has a small value that is approximately constant and close to zero. Therefore, the change amount of the added torque input area Sm is small until the point immediately before the film type is changed, and it is rapidly increased when the film type is started to be changed. Therefore, it can be said that the polishing end is not readily erroneously detected in the method of the present embodiment using the relative input R, the torque input areas $\Delta_{s1}, \Delta_{s2}, \Delta_{s3}, \ldots$, and the added torque input area Sm.

In comparison between the added torque input area Sm and the threshold value Sth, when the film type is changed from the Cu film, which is the conductive film to be polished, to the Ta film, the relation that the added torque input area Sm is larger than the threshold value Sth is established; thus, the polishing end of the Cu film is detected. When the film type is changed, for example, from the Ta film to the oxide film, the relation that the added torque input area Sm is smaller than the threshold value Sth is established, thus, the polishing end of the Ta film is detected.

When how much the inclination of the relative input R is increased or reduced is obtained by converting that into areas after measurement is started in the manner described above, the torque input area Δs is also increased when the inclination of the relative input R is large, and the torque input area Δs is reduced when the inclination is small; therefore, the polishing end of the conductive film to be polished can be detected while preventing erroneous detection.

It is difficult to detect the moment when the conductive film to be polished is completely removed as polishing end. Therefore, when over-polish time is provided by another parameter and the polishing process is terminated after polishing is continued for certain time from the end detected by the present algorithm, complete removal of the conductive film to be polished can be ensured.

A comparative example with respect to the calculation method of the torque input areas Δs and the added torque input area Sm described with reference to FIG. 7 will be described with reference to FIGS. 8(a) and 8(b).

In this comparative example, in FIG. 8(a), changes in relative input between measurement initiation and minute time Δt are areas Δs, and the sum thereof is accumulated as an added area Sm as shown in an expression (2), and polishing end is determined depending on the fact whether the added area Sm has exceeded the provided threshold value Sth or not.

$$Sm = \Sigma \Delta s \qquad (2)$$

In other words, the added area Sm is obtained as a total area between the waveform of the relative input during Δt and the x axis from the point of measurement initiation. However, in the method of this comparative example, the possibility of erroneous detection of polishing end is increased in the case shown in FIG. 8(b).

In FIG. 8(b), after an average value Av of n times of torque input is calculated, the waveform of the relative input is once increased at a point C in the drawing after measurement is started, and it is unchanged for a while thereafter. In this case, since the area of a region D has a value that is not small and close to zero, the added area Sm is increased, thereby leading to erroneous detection of polishing end. Although FIG. 8(b) is an extreme example, the same applies to waveform of relative input "inclination is gradually changed over long period of time".

As described above, in the polishing end point detection method according to the present embodiment, since the respective torque input 2 after average value acquisition is the relative input R with respect to the average value Av, influence to polishing end detection can be removed and erroneous detection can be prevented even when differences are generated in the torque input 2 due to individual differences of the conductive film to be polished on the wafer.

When the changed amounts of the relative input R in predetermined time intervals are assumed to be torque input areas $\Delta_{s1}, \Delta_{s2}, \Delta_{s3}, \ldots$, respectively, and the torque input area Sm, which is obtained by adding the torque input areas $\Delta_{s1}, \Delta_{s2}, \Delta_{s3}, \ldots$, is compared with the threshold value Sth, the polishing end can be reliably detected in real time with a small amount of calculation.

When the case in which the added torque input area Sm is changed to be larger than or smaller than the threshold value Sth is determined in accordance with the film type of the layer below the conductive film to be polished, polishing end can be reliably detected.

Note that, various modifications can be made in the present invention without departing from the spirit of the present invention, and it goes without saying that the present invention also pertains to the modifications.

What is claimed is:

1. A polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect a polishing end point of the predetermined film, the polishing end point detection method including:

a first process of measuring a torque creating measured data;

a second process of analyzing a periodic component in the measured data by subjecting Fourier transformation to the measured data;

a third process of calculating a moving average processing time for removing a varied periodic noise component based on the periodic component;

a fourth process of correcting a waveform creating a corrected waveform by performing an averaging process based on the moving average processing time, with the averaging process being calculated continuously during polishing in real time for the measured data; and a fifth process of detecting a polishing end point of the predetermined film based on change in the corrected waveform detected by differentiation of the corrected waveform, whereby both fixed and varied periodic components are analyzed and the change in the corrected waveform is determined by differentiation in detecting the polishing end point.

2. A polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect a polishing end point of the predetermined film, the polishing end point detection method including:
- a first process of measuring a torque creating measured data;
- a second process of analyzing a periodic component in the measured data by subjecting Fourier transformation to the measured data;
- a third process of calculating a moving average processing time for removing a varied periodic noise component based on the periodic component;
- a fourth process of correcting a waveform creating a corrected waveform by performing an averaging process based on the moving average processing time, with the averaging process being calculated continuously during polishing in real time for the measured data; and
- a fifth process of calculating a first differentiation value of the corrected waveform and detecting the polishing end point of the predetermined film based on a change in at least either a ratio of the first differentiation value of a predetermined polishing end with respect to the first differentiation value of a predetermined polishing beginning or a difference between the first differentiation value of the predetermined polishing end and the first differentiation value of the predetermined polishing beginning,
- whereby both fixed and varied periodic components are analyzed in detecting the polishing end point.

3. A polishing end point detection method utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection method including:
- a first process of measuring a torque or an index corresponding to the torque;
- a second process of analyzing a periodic component in the measured data by subjecting Fourier transformation to the measured data;
- a third process of calculating a moving average processing time for removing a varied periodic noise component based on the periodic component;
- a fourth process of correcting a waveform creating a corrected waveform by performing an averaging process based on the moving average processing time, with the average process being calculated continuously during polishing in real time for the measured data; and
- a fifth process of performing second differentiation of the corrected torque waveform and detecting the polishing end point of the predetermined film based on a changing point in the second differentiation waveform of a predetermined polishing end;
- whereby both fixed and varied periodic components are analyzed in detecting the polishing end point.

4. The polishing end point detection method utilizing torque change according to claim 1, 2, or 3, wherein
- the measured data is subjected to Fourier transformation so as to analyze a plurality of periodic components in the measured data in the second step, a plurality of Moving average processing times corresponding to the plurality of periodic components is calculated in the third step, and a plurality of averaging processes are performed based on the plurality of moving average processing times calculated continuously during polishing in real time for the measured data so as to correct the waveform in the fourth step.

5. A polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect a polishing end point of the predetermined film, the polishing end point detection device including:
- torque measurement means for measuring a torque creating measured data;
- periodic component analysis means for analyzing a periodic component in the measured data by subjecting Fourier transformation to the measured data;
- average processing time calculation means for calculating a moving average processing time for removing a varied periodic noise component based on the analyzed periodic component;
- average processing means for correcting a waveform creating a corrected waveform by performing an averaging process based on the moving average processing time, with the average process being calculated continuously during polishing in real time for the measured data;
- differential means for differentiating the corrected waveform creating a differentiated corrected waveform; and
- end point detection means for detecting a polishing end point of the predetermined film based on an inflection in the differentiated corrected waveform,
- whereby both fixed and varied periodic components are analyzed and the change in the corrected waveform is determined by differentiation in detecting the polishing end point.

6. A polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect a polishing end point of the predetermined film, the polishing end point detection device including:
- torque measurement means for measuring a torque creating measured data;
- periodic component analysis means for analyzing a periodic component in the measured data by subjecting Fourier transformation to the measured data;
- average processing time calculation means for calculating a moving average processing time for removing a varied periodic noise component based on the analyzed periodic component;
- average processing means for correcting a waveform creating a corrected waveform by performing an averaging process based on the moving average processing time, with the averaging process being calculated continuously during polishing in real time for the measured data; and
- end point detection means for calculating a first differentiation value of the corrected waveform and detecting the polishing end point of the predetermined film based on change in at least either a ratio of the first differentiation value of a predetermined polishing end with respect to the first differentiation value of a predetermined polishing beginning or a difference between the first differentiation value of the predetermined polishing end and the first differentiation value of the predetermined polishing beginning, whereby both fixed and varied periodic components are analyzed in detecting the polishing end point.

7. A polishing end point detection device utilizing torque change in which a wafer having a predetermined film having minute irregularities on the surface is retained by a polishing head, the predetermined film is pressed against and polished by a polishing pad provided on a surface of a rotating platen while rotating the polishing head, and data representing torque of the polishing changed along with progress of the polishing is monitored so as to detect polishing end point of the predetermined film, the polishing end point detection device including:

a torque measurement means of measuring a torque creating measured data;

a periodic component analysis means of analyzing a periodic component in the measured data by subjecting Fourier transformation to the measured data;

an average processing time calculation means of calculating a moving average processing time for removing a varied periodic noise component based on the analyzed periodic component;

an average processing means of correcting a waveform creating a corrected waveform by performing an averaging process based on the moving average processing time, with the averaging process being calculated continuously during polishing in real time for the measuring data; and an end point detection means of performing second differentiation of the corrected torque waveform and detecting the polishing end point of the predetermined film based on a changing point in the second differentiation waveform of a predetermined polishing end;

whereby both fixed and varied periodic components are analyzed in detecting the polishing end point.

8. The polishing end point detection device utilizing torque change according to claim 5, 6, or 7, wherein the measured data is subjected to Fourier transformation so as to analyze a plurality of periodic components in the measured data by the periodic component analysis means, a plurality of moving average processing times corresponding to the plurality of periodic components is calculated by the average processing time calculation means, and a plurality of averaging processes are performed based on the plurality of moving average processing times calculated continuously during polishing in real time for the measured data so as to correct the waveform by the average processing means.

* * * * *